United States Patent
Pai et al.

(10) Patent No.: US 12,057,527 B2
(45) Date of Patent: Aug. 6, 2024

(54) LIGHT EMITTING DIODE

(71) Applicant: Au Optronics Corporation, Hsinchu (TW)

(72) Inventors: Chia-Hui Pai, Hsinchu (TW); Wen-Hsien Tseng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 380 days.

(21) Appl. No.: 17/504,534

(22) Filed: Oct. 19, 2021

(65) Prior Publication Data
US 2022/0367758 A1 Nov. 17, 2022

(30) Foreign Application Priority Data
May 14, 2021 (TW) ................................. 110117541

(51) Int. Cl.
| | |
|---|---|
| *H01L 33/44* | (2010.01) |
| *H01L 23/00* | (2006.01) |
| *H01L 33/38* | (2010.01) |
| *H01L 33/62* | (2010.01) |
| *H01L 25/075* | (2006.01) |

(52) U.S. Cl.
CPC .............. *H01L 33/44* (2013.01); *H01L 24/95* (2013.01); *H01L 24/98* (2013.01); *H01L 33/38* (2013.01); *H01L 33/62* (2013.01); *H01L 24/29* (2013.01); *H01L 24/83* (2013.01); *H01L 25/0753* (2013.01); *H01L 2224/2957* (2013.01); *H01L 2224/83005* (2013.01); *H01L 2224/95001* (2013.01); *H01L 2224/98* (2013.01)

(58) Field of Classification Search
CPC ......... H01L 33/44; H01L 33/38; H01L 33/62; H01L 33/382; H01L 33/0093; H01L 24/95; H01L 24/98; H01L 24/29; H01L 24/83; H01L 25/0753; H01L 2224/2957; H01L 2224/83005; H01L 2224/95001; H01L 2224/98; H01L 2221/68322; H01L 2221/68368; H01L 2221/68381; H01L 21/6835; H01L 27/156
See application file for complete search history.

(56) References Cited

U.S. PATENT DOCUMENTS

| | | | |
|---|---|---|---|
| 9,123,596 B2 | 9/2015 | Chang et al. | |
| 2011/0147779 A1* | 6/2011 | Kang | H01L 33/486 |
| | | | 257/E33.056 |

(Continued)

FOREIGN PATENT DOCUMENTS

| | | |
|---|---|---|
| CN | 108583024 | 9/2018 |
| TW | I479464 | 4/2015 |

*Primary Examiner* — Kyoung Lee
*Assistant Examiner* — Christina A Sylvia
(74) *Attorney, Agent, or Firm* — JCIPRNET (57) ABSTRACT

A light emitting diode includes a first semiconductor layer, a second semiconductor layer, a first pad, a second pad, and a protection bump. The first semiconductor layer and the second semiconductor layer are overlapping with each other. An area of a first surface of the first semiconductor layer is larger than an area of a second surface of the second semiconductor layer. The first surface faces the second surface. The first pad is electrically connected to the first semiconductor layer. The second pad is electrically connected to the second semiconductor layer. The protection bump is located between the first pad and the second pad.

19 Claims, 9 Drawing Sheets (56) References Cited

U.S. PATENT DOCUMENTS

| | | | |
|---|---|---|---|
| 2014/0217436 A1* | 8/2014 | Hussell | H01L 33/62 |
| | | | 438/27 |
| 2014/0332827 A1 | 11/2014 | Chang et al. | |
| 2018/0090639 A1* | 3/2018 | Ting | H01L 33/0093 |
| 2019/0115511 A1* | 4/2019 | Lin | H01L 33/10 |
| 2019/0181317 A1* | 6/2019 | Yu | H01L 25/0753 |
| 2023/0317763 A1* | 10/2023 | Oh | H01L 27/156 |
| | | | 257/91 |

* cited by examiner

LIGHT EMITTING DIODE

CROSS-REFERENCE TO RELATED APPLICATION

This application claims the priority benefit of Taiwan application serial no. 110117541, filed on May 14, 2021. The entirety of the above-mentioned patent application is hereby incorporated by reference herein and made a part of this specification.

BACKGROUND

Technical Field

The present invention relates to a light emitting diode.

Description of Related Art

Micro light emitting diode display (micro LED display) is a new generation of display technology. The key technology is how to transfer a large number of micro LEDs onto a circuit board.

However, the transfer technology is a mechanical operation, and the effectiveness of the transfer technology depends on the accuracy of the machine and the accuracy and yield of the transfer tool itself. When extracting micro LEDs, a machine operating error and a transfer tool accuracy error may exist. When placing the micro LEDs, another machine operating error and an alignment error nay exist. If the micro LEDs are not placed on the correct positions, the micro LEDs will not operate normally. Therefore, there is an urgent need for a method that can cure the aforementioned problems.

SUMMARY

The invention provides a light-emitting diode, which can improve the yield of a laser transfer process.

At least one embodiment of the present invention provides a light emitting diode. The light emitting diode includes a first semiconductor layer, a second semiconductor layer, a first pad, a second pad, and a protection bump. The first semiconductor layer and the second semiconductor layer are overlapping with each other. An area of a first surface of the first semiconductor layer is larger than an area of a second surface of the second semiconductor layer. The first surface faces the second surface. The first pad is electrically connected to the first semiconductor layer. The second pad is electrically connected to the second semiconductor layer. The protection bump is located between the first pad and the second pad.

At least one embodiment of the present invention provides a light emitting diode. The light emitting diode includes a first semiconductor layer, a second semiconductor layer, an insulating layer, a first pad, a second pad, a first conductive via, and a second conductive via. The second semiconductor layer is overlapping with the first semiconductor layer. The insulating layer is located on the second semiconductor layer. The first pad and the second pad are located on the insulating layer. Both of the first pad and the second pad are overlapping with the second semiconductor layer. The first conductive via penetrates the second semiconductor layer and the insulating layer, and electrically connects the first pad to the first semiconductor layer. The second conductive via penetrates the insulating layer and electrically connects the second pad to the second semiconductor layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1F are schematic cross-sectional views of a method of manufacturing a light emitting diode display device according to an embodiment of the present invention.

Figure 1A:
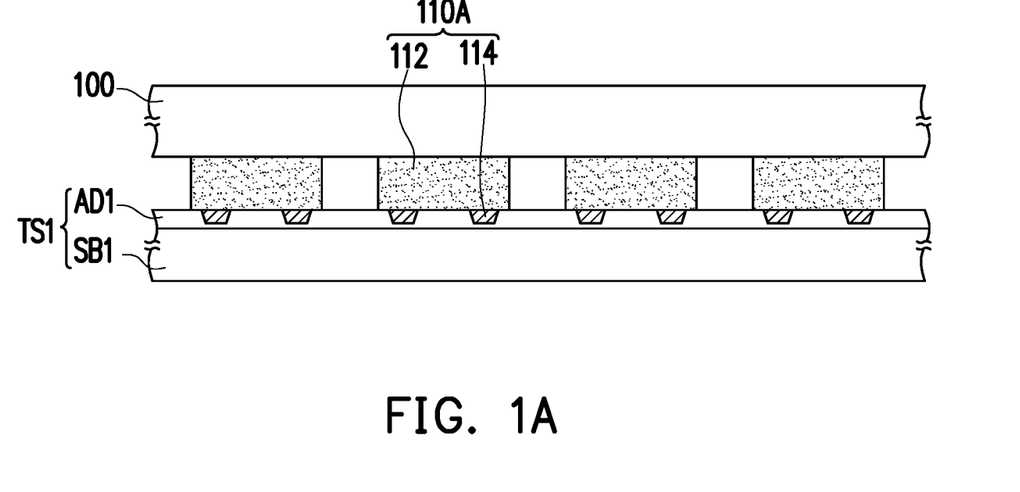
FIG. 1A to FIG. 1F are schematic cross-sectional views of a method of manufacturing a light emitting diode display device according to an embodiment of the present invention.

Referring to FIG. 1A, a plurality of light emitting diodes 110A are formed on the growth substrate 100. The growth substrate 100 is a gallium arsenide (GaAs) substrate, a gallium phosphide (GaP) substrate, an indium phosphide (InP) substrate, a sapphire substrate, a silicon carbide (SiC) substrate, a gallium nitride (GaN) substrate or other growth substrates suitable for epitaxy process. In some embodiments, the surface of the growth substrate 100 is patterned through an etching process (for example, wet etching), so that the growth substrate 100 has a concave and convex surface, such as a patterned sapphire substrate (PSS).

The light emitting diode 110A includes a stacked semiconductor layer 112 and two pads 114 on the stacked semiconductor layer 112, wherein the pads 114 are located on a side of the stacked semiconductor layer 112 away from the growth substrate 100.

The light emitting diode 110A on the growth substrate 100 is adhered to a first transposed substrate TS1. In this embodiment, the first transposed substrate TS1 includes a substrate SB1 and an adhesive layer AD1. In some embodiments, a material of the substrate SB1 is, for example, glass, sapphire or other suitable materials. The growth substrate 100 is moved onto the first transposed substrate TS1, and the pads 114 of the light-emitting diode 110A on the growth substrate 100 face the adhesive layer AD1 of the first transposed substrate TS1.

Figure 1B:
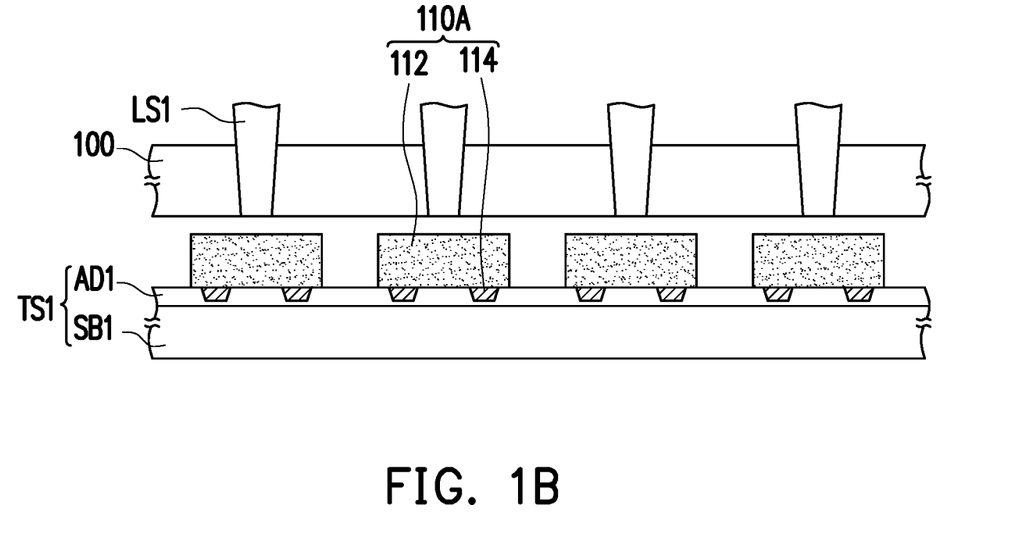

Referring to FIG. 1B, one or more light-emitting diodes 110A are transferred from the growth substrate 100 onto the adhesion layer AD1 of the first transposed substrate TS1 by means of laser lift off. Then, the growth substrate 100 is removed. In this embodiment, the laser LS1 is irradiated from a side of the growth substrate 100 opposite to the light-emitting diodes 110A, thereby peeling the light-emitting diodes 110A from the growth substrate 100.

Figure 1C:
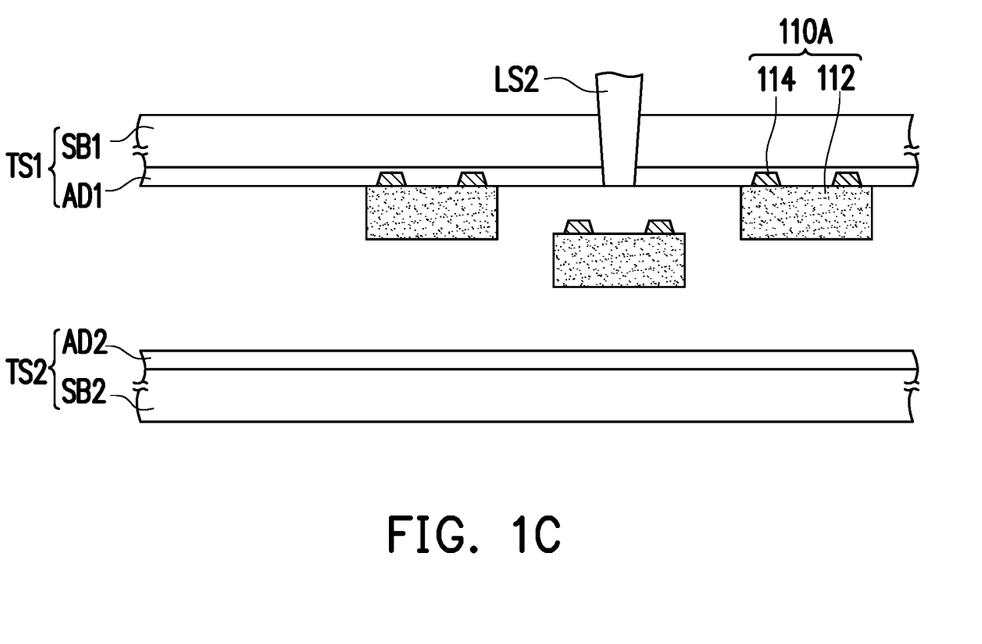

Referring to FIG. 1C, a second transposed substrate TS2 is provided. The second transposed substrate TS2 includes a substrate SB2 and an adhesive layer AD2. In some embodiments, the material of the substrate SB2 is, for example, glass, sapphire or other suitable materials.

The first transposed substrate TS1 and/or the second transposed substrate TS2 are moved to align the first transposed substrate TS1 with the second transposed substrate TS2. Then, the light-emitting diodes 110A are irradiated with a laser LS2 from a side of the substrate SB1, and selected one or more light-emitting diodes 110A are transferred from the first transposed substrate TS1 to the adhesive layer AD2 of the second transposed substrate TS2 by means of laser transfer. In the same time, the pads 114 of the light emitting diodes 110A are located on the side of the semiconductor stack 112 away from the second transposed substrate TS2.

In this embodiment, the laser LS2 is irradiated from a side of the first transposed substrate TS1 facing away from the light-emitting diodes 110A, thereby peeling the light-emitting diodes 110A from the first transposed substrate TS1. In some embodiments, the laser LS2 causes the adhesive layer AD1 to generate a physical and/or chemical reaction. For example, the laser LS2 focuses on the adhesive layer AD1 to cause the adhesive layer AD1 to generate gas. The light emitting diodes 110A can leave the first transposed substrate TS1 by the force of gas expansion.

In some embodiments, the wavelength of the laser LS2 is 266 nm to 365 nm, and the beam size of the laser LS2 is 1 μm to 10 μm. In some embodiments, the accuracy of the laser LS2 is within 1 micrometer. In other words, the deviation distance of the actual focus position of the laser LS2 due to the process deviation is less than 1 micrometer.

Although only one laser LS2 irradiated on a light-emitting diode 110A is shown in FIG. 1C, but the invention is not limited thereto. In some embodiments, two lasers LS2 are irradiated on light-emitting diodes 110A so as to perform the laser transfer process.

Figure 1D:
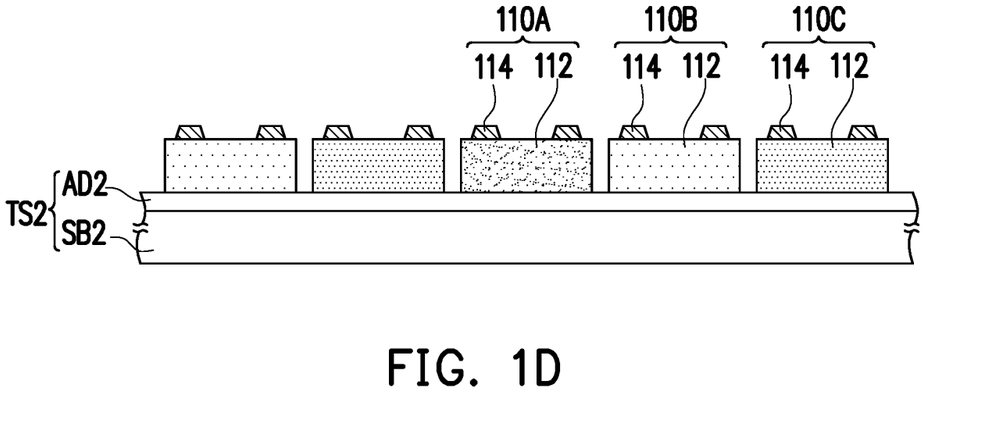

Referring to FIG. 1D, the steps of FIG. 1A to FIG. 1C are repeated a plurality times, thereby transferring light-emitting diodes 110B and light-emitting diodes 110C to the second transposed substrate TS2. The light-emitting diodes 110A, the light-emitting diodes 110B, and the light-emitting diodes 110C are, for example, light-emitting diodes of different colors. It should be noted that FIG. 1A to FIG. 1F omit part of the structure of the light-emitting diodes 110A, 110B, and 110C. The light-emitting diodes 110A, 110B, and 110C can be the light-emitting diodes described in any of the embodiments described later.

Figure 1E:
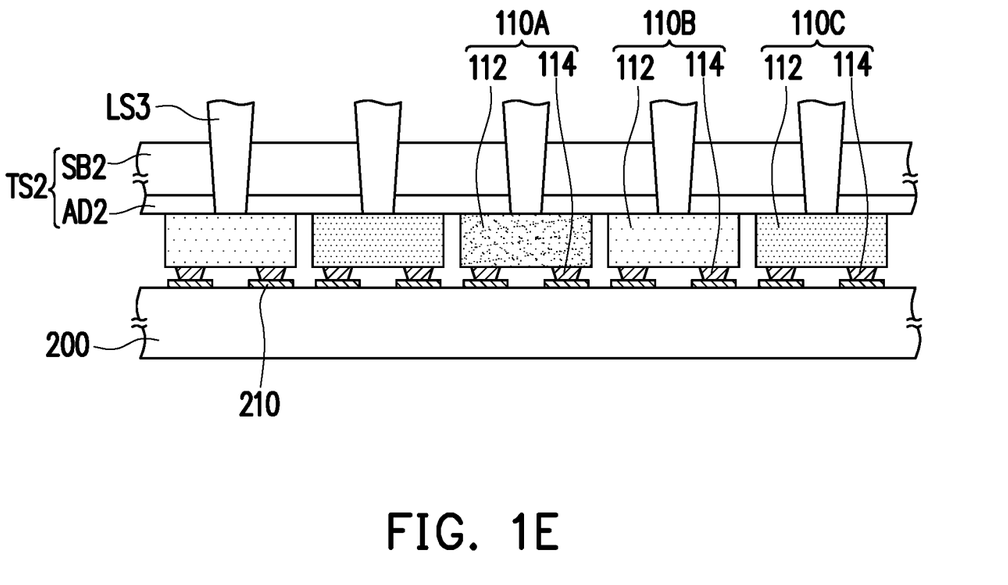

Referring to FIG. 1E, the light-emitting diodes 110A, the light-emitting diodes 110B, and the light-emitting diodes 110C are transferred from the second transposed substrate TS2 to a circuit substrate 200. In this embodiment, the circuit substrate 200 is a rigid circuit substrate or a flexible circuit substrate. The circuit substrate 200 has a plurality of pads 210.

The laser L3 is irradiated on the light emitting diodes 110A, 110B, and 110C from a back side of the second transposed substrate TS2, so that the pads 114 of the light emitting diodes 110A, 110B, and 110C are electrically connected to the pads 210 of the circuit board 200 through solders (not shown). In other embodiments, there is no need to electrically connect the light-emitting diodes 110A, 110B, and 110C to the pads 210 through the laser L3 and solders. For example, the light-emitting diodes 110A, 110B, and 110C and the pads 210 can also be electrically connected to each other by anisotropic conductive glue or other materials.

Figure 1F:
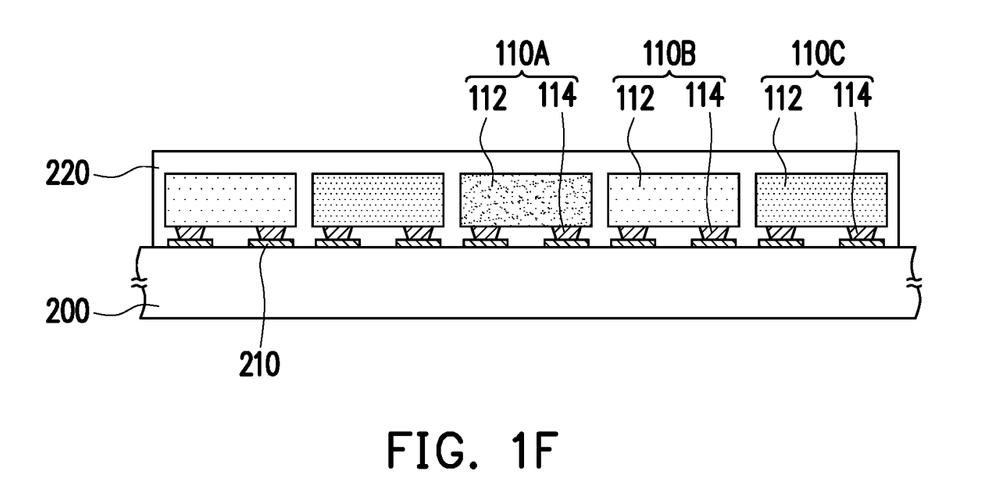

Next, referring to FIG. 1F, the second transposed substrate TS2 is removed. Then, the light-emitting diodes 110A, 110B, and 110C are encapsulated on the circuit substrate 200 with an encapsulation material 220.

Figure 2A:
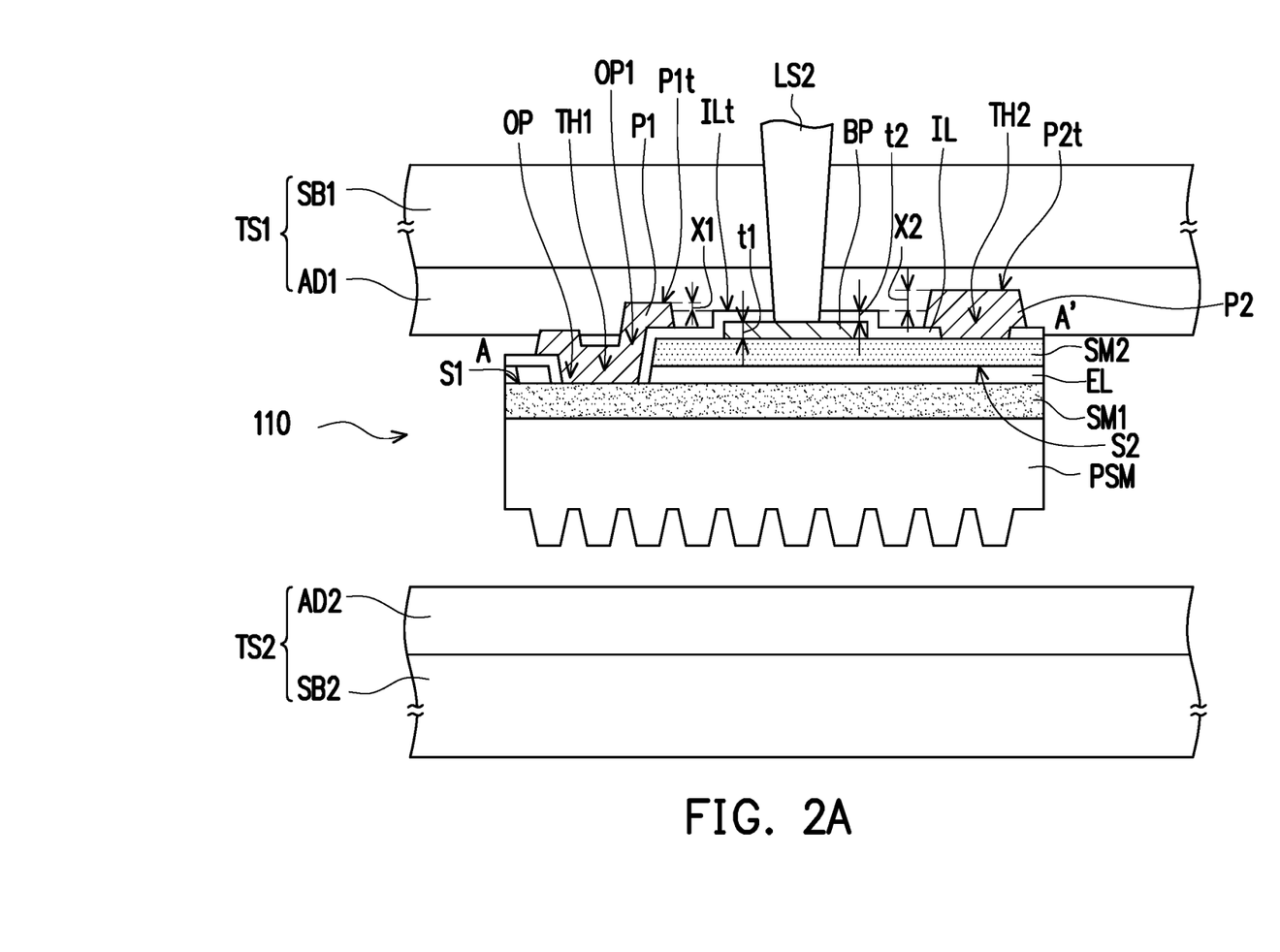
FIG. 2A is a schematic cross-sectional view of a manufacturing method of a light emitting diode display device according to an embodiment of the present invention.
Figure 2B:
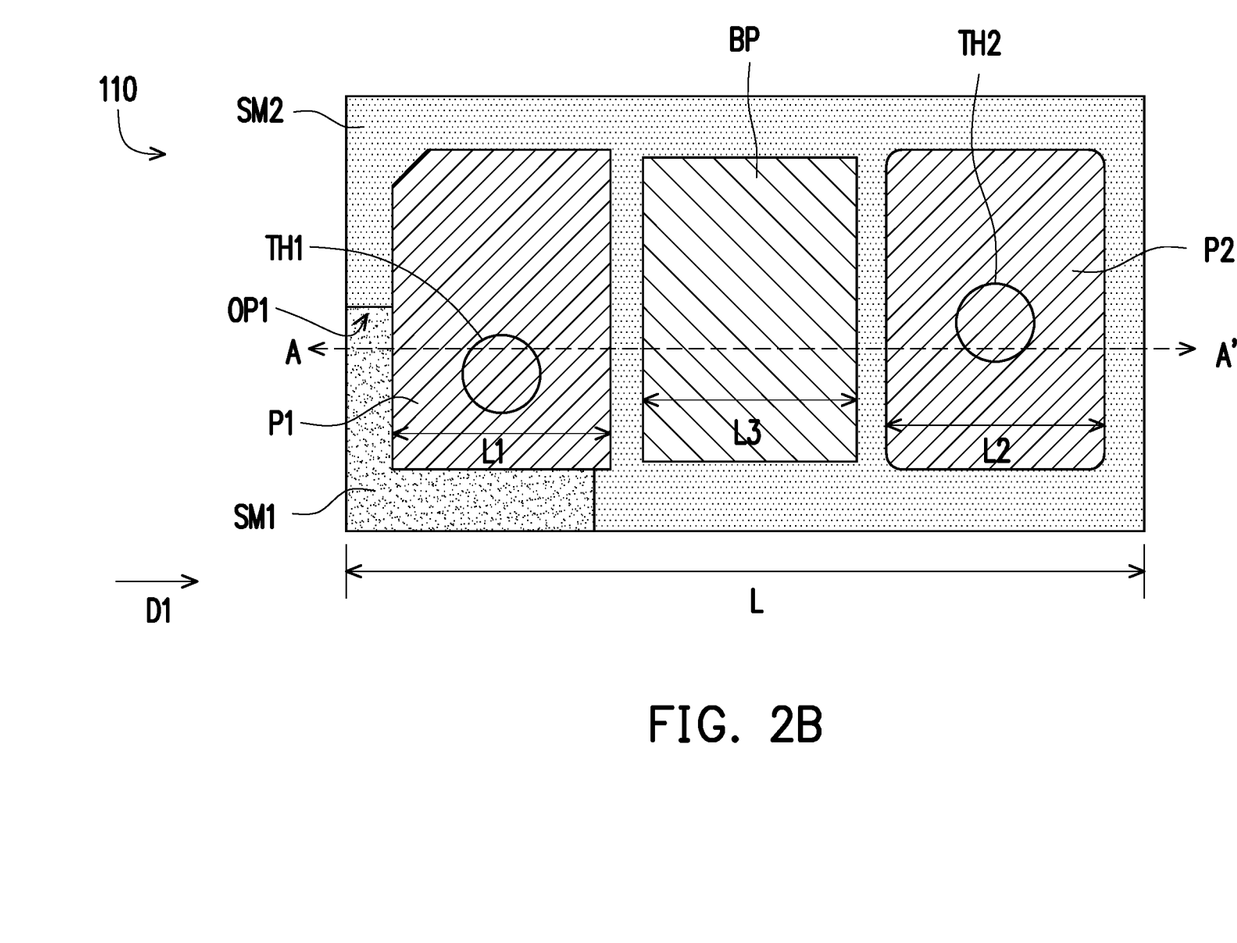
FIG. 2B is a schematic top view of the light emitting diode of FIG. 2A.

FIG. 2A is a schematic cross-sectional view of a manufacturing method of a light emitting diode display device according to an embodiment of the present invention. FIG. 2B is a schematic top view of the light emitting diode of FIG. 2A. The light-emitting diode of FIG. 2A corresponds to the position of the line A-A' in FIG. 2B. For the convenience of description, some components of the light-emitting diode are omitted in FIG. 2B.

FIG. 2A corresponds to the step of FIG. 1C that is the laser transfer step of transferring the light-emitting diodes 110 from the first transposed substrate TS1 to the second transposed substrate TS2.

Referring to FIG. 2A and FIG. 2B, in this embodiment, the light emitting diode 110 includes a first semiconductor layer SM1, a second semiconductor layer SM2, a first pad P1, a second pad P2, and a protection bump BP. In this embodiment, the light emitting diode 110 further includes a light emitting layer EL, an insulating layer IL, and a patterned semiconductor layer PSM.

The first semiconductor layer SM1 and the second semiconductor layer SM2 are overlapping with each other. A first surface S1 of the first semiconductor layer SM1 faces a second surface S2 of the second semiconductor layer SM2. The second semiconductor layer SM2 has a first opening OP1 such that an area of the first surface S1 of the first semiconductor layer SM1 is larger than an area of the second surface S2 of the second semiconductor layer SM2.

One of the first semiconductor layer SM1 and the second semiconductor layer SM2 is an N-type doped semiconductor, and the other is a P-type doped semiconductor. For example, the first semiconductor layer SM1 is an N-type semiconductor layer, and the second semiconductor layer SM2 is a P-type semiconductor layer. In some embodiments, the materials of the first semiconductor layer SM1 and the second semiconductor layer SM2 include, for example, gallium nitride, indium gallium nitride (InGaN), gallium arsenide, aluminum gallium indium phosphide (AlGaInP), or other materials composed of IIIA group and VA group elements, or other suitable materials, but the invention is not limited thereto.

The light emitting layer EL is located between the first surface S1 of the first semiconductor layer SM1 and the second surface S2 of the second semiconductor layer SM2. The light-emitting layer EL has, for example, a quantum well (QW), such as a single quantum well (SQW), a multiple quantum well (MQW) or other quantum wells. The holes provided by the P-type doped semiconductor layer and the electrons provided by the N-type doped semiconductor layer can combine in the light-emitting layer EL and release energy in the form of light. The light emitting layer EL has an opening OP, and the opening OP of the light emitting layer EL is overlapping with the first opening OP1 of the second semiconductor layer SM2.

The patterned semiconductor layer PSM is located on a side of the first semiconductor layer SM1 opposite to the second semiconductor layer SM2. In some embodiments, the material of the patterned semiconductor layer PSM includes, for example, gallium nitride, indium gallium nitride (InGaN), gallium arsenide, aluminum gallium indium phosphide (AlGaInP), or other materials composed of IIIA group and VA group elements, or other suitable materials. In some embodiments, the patterned semiconductor layer PSM includes the same material as the first semiconductor layer SM1, but the doping concentration of the patterned semiconductor layer PSM is, for example, less than the doping concentration of the first semiconductor layer SM1. In some embodiments, the patterned semiconductor layer PSM is an undoped semiconductor layer.

The insulating layer IL is located on the surface of the first semiconductor layer SM1, the surface of the light emitting layer EL, and the surface of the second semiconductor layer SM2. The insulating layer IL has a first hole TH1 and a second hole TH2. The first hole TH1 is overlapping with the first opening OP1 of the second semiconductor layer SM2 and the opening OP of the light emitting layer EL. The first semiconductor layer SM1 is exposed at the bottom of the first hole TH1, and the second semiconductor layer SM2 is exposed at the bottom of the second hole TH2.

The first pad P1 and the second pad P2 are located on the insulating layer IL, and the first pad P1 and the second pad P2 are respectively located in the first hole TH1 and the second hole TH2. The first pad P1 is electrically connected to the first semiconductor layer SM1. The second pad P2 is electrically connected to the second semiconductor layer SM2. The first pad P1 and the second pad P2 have a single-layer or multi-layer structure, and the materials thereof include, for example, metals, conductive oxides, conductive nitrides, or other suitable conductive materials. In some embodiments, the deviation distance of the positions of the first pad P1 and the second pad P2 due to the process deviation is less than 2 micrometers.

The protection bump BP is located between the first pad P1 and the second pad P2. In this embodiment, the protection bump BP is formed on the second semiconductor layer SM2, and the protection bump BP and the second pad P2 are directly in contact with the second semiconductor layer SM2. The protection bump BP is not in contact with the first pad P1 and the second pad P2. In some embodiments, the protection bump BP is located between the insulating layer IL and the second semiconductor layer SM2, thereby preventing the first pad P1 and/or the second pad P2 from directly in contact with the protection bump BP. In this embodiment, the material of the protection bumps BP includes metal (such as gold, silver, aluminum, or alloys thereof, or other metal materials), inorganic materials (such as titanium oxide, silicon oxide, or the stacked layers thereof, or other inorganic materials) or organic material. In some embodiments, the protection bump BP includes a material with a transmittance for the laser LS2 of less than 10%.

In this embodiment, when performing the laser transfer, the laser LS2 is aligned with the position of the protection bump BP. Compared with using two lasers LS2 respectively aligned with the first pad P1 and the second pad P2, using the laser LS2 aligned with the protection bump BP can prevent the rotation issue of the light emitting diode 110 when the light emitting diode 110 leaving the adhesive layer AD1, so as to improve the yield of laser transfer. In other words, in this embodiment, the arrangement of the protection bump BP can improve the yield of the laser transfer process.

In some embodiments, taking the first surface S1 of the first semiconductor layer SM1 as a reference, the height of the topmost surface ILt of the insulating layer IL is lower than the height of the topmost surface P1t of the first pad P1, and the two have a height difference X1. Similarly, taking the first surface S1 of the first semiconductor layer SM1 as a reference, the height of the topmost surface ILt of the insulating layer IL is lower than the height of the topmost surface P2t of the second pad P2, and the two have a height difference X2. In some embodiments, the height difference X1 is less than or equal to the height difference X2. Since the height of the topmost surface ILt of the insulating layer IL is lower than the height of the topmost surface P1t of the first pad P1 and the height of the topmost surface P2t of the second pad P2, it is possible to prevent the insulating layer IL from affecting the process of electrically connecting the first pad P1 and the second pad P2 to the circuit substrate (such as the process as shown in FIG. 1E). In this embodiment, the thickness t1 of the protection bump BP is 50 nm to 5000 nm. In this embodiment, the thickness t2 of the insulating layer IL is 20 nm to 2000 nm.

Referring to FIG. 2B, the first pad P1 and the second pad P2 are arranged in the first direction D1. The length of the light emitting diode 110 in the first direction D1 is L. The length of the first pad P1 in the first direction D1 is L1. The length of the second pad P2 in the first direction D1 is L2. The length L3 of the protection bump BP in the first direction D1 is between 3 micrometers and (L-L1-L2-4) micrometers, thereby preventing the protection bump BP from overlapping with the first pad P1 and/or the second pad P2 due to process deviation. At the same time, the laser LS2 may not exceed the range of the protection bump BP, and the semiconductor layer of the light emitting diode 110 can be prevented from being damaged by the laser LS2.

Figure 3:
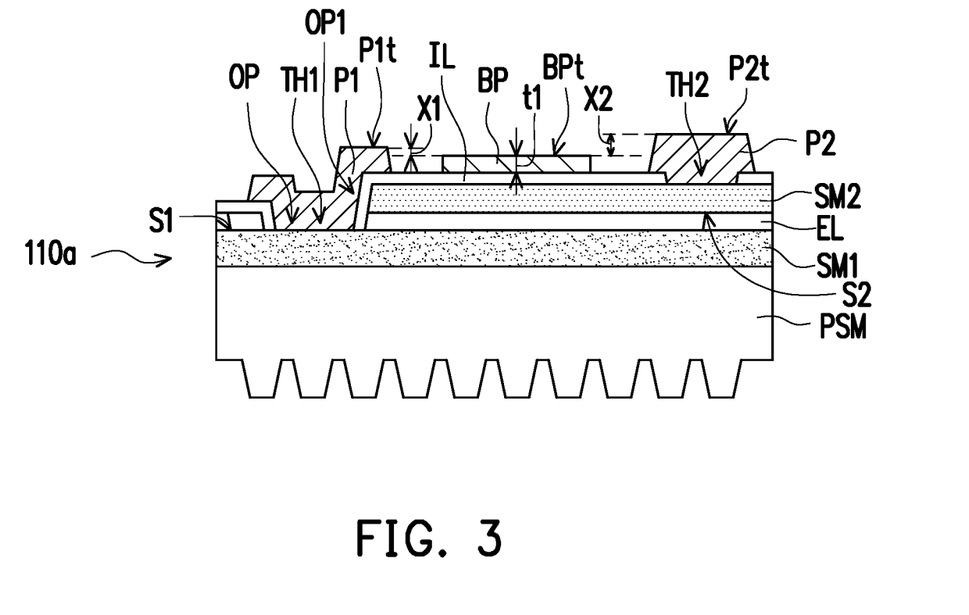
FIG. 3 is a schematic cross-sectional view of a light emitting diode according to an embodiment of the invention.

FIG. 3 is a schematic cross-sectional view of a light emitting diode according to an embodiment of the invention. It must be noted here that the embodiment of FIG. 3 follows the reference numerals and partial contents of the embodiment of FIG. 2A and FIG. 2B, wherein the same or similar components are denoted by the same or similar reference numerals, and the description of the same technical content is omitted. For the description of the omitted parts, reference may be made to the foregoing embodiments and will not be repeated in the following embodiments.

The difference between the light-emitting diode 110a of FIG. 3 and the light-emitting diode 110 of FIG. 2A and FIG. 2B is that in the light-emitting diode 110a, the protection bump BP is formed on the insulating layer IL.

Referring to FIG. 3, the protection bump BP is formed on the insulating layer IL, and the insulating layer IL is located between the protection bump BP and the second semiconductor layer SM2.

In this embodiment, the protection bump BP is not in contact with the second semiconductor layer SM2, the first pad P1 and the second pad P2. In this embodiment, the material of the protection bump BP includes metal (such as gold, silver, aluminum, or alloys thereof, or other metal materials), inorganic materials (such as titanium oxide, silicon oxide, or stacked layers thereof, or other inorganic materials) or organic materials or stacked layers of the foregoing materials. In some embodiments, the protection bump BP includes a material with a transmittance for the laser LS2 of less than 10%.

In this embodiment, when performing the laser transfer, the laser is aligned with the position of the protection bump BP. Compared with using two lasers LS2 respectively aligned with the first pad P1 and the second pad P2, using the laser LS2 aligned with the protection bump BP can prevent the rotation issue of the light emitting diode 110 when the light emitting diode 110 leaving the adhesive layer AD1, so as to improve the yield of laser transfer. In other words, in this embodiment, the arrangement of the protection bump BP can improve the yield of the laser transfer process.

In some embodiments, taking the first surface S1 of the first semiconductor layer SM1 as a reference, the height of the topmost surface BPt of the protection bump BP is lower than the height of the topmost surface P1t of the first pad P1, and the two have a height difference X1. Similarly, taking the first surface S1 of the first semiconductor layer SM1 as a reference, the height of the topmost surface BPt of the protection bump BP is lower than the height of the topmost surface P2t of the second pad P2, and the two have a height difference X2. In some embodiments, the height difference X1 is less than or equal to the height difference X2. Since the height of the topmost surface BPt of the protection bump BP is lower than the height of the topmost surface P1t of the first pad P1 and the height of the topmost surface P2t of the second pad P2, it is possible to prevent the protection bump BP from affecting the process of electrically connecting the first pad P1 and the second pad P2 to the circuit substrate (such as the process as shown in FIG. 1E). In this embodiment, the thickness t1 of the protection bump BP is 50 nm to 5000 nm.

Figure 4:
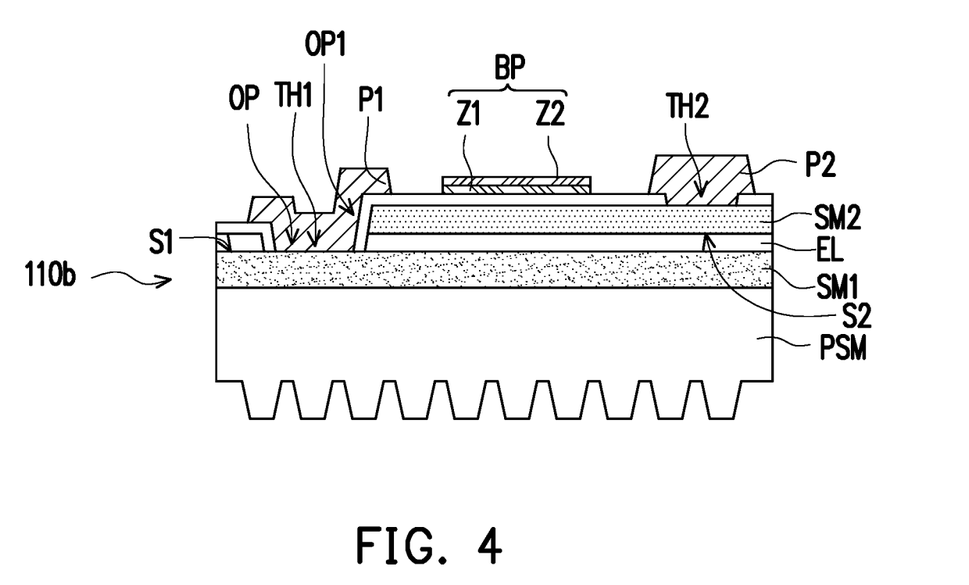
FIG. 4 is a schematic cross-sectional view of a light emitting diode according to an embodiment of the invention.

FIG. 4 is a schematic cross-sectional view of a light emitting diode according to an embodiment of the invention. It must be noted here that the embodiment of FIG. 4 follows the reference numerals and partial contents of the embodiment of FIG. 3, wherein the same or similar components are denoted by the same or similar reference numerals, and the description of the same technical content is omitted. For the description of the omitted parts, reference may be made to the foregoing embodiments and will not be repeated in the following embodiments.

The difference between the light-emitting diode 110b of FIG. 4 and the light-emitting diode 110a of FIG. 3 is that in the light-emitting diode 110b, the protection bump BP is a multi-layer structure.

Referring to FIG. 4, the protection bump BP is a multi-layer structure and includes a first layer Z1 and a second layer Z2. The first layer Z1 and the second layer Z2 include different materials. For example, the first layer Z1 and the second layer Z2 are respectively titanium oxide and silicon oxide. In some embodiments, the protection bump BP further includes a third layer (not shown), the second layer Z2 is located between the first layer Z1 and the third layer, wherein the first layer Z1 and the third layer include titanium oxide, and the second layer Z2 includes silicon oxide. In some embodiments, there is more than one silicon oxide layer between the first layer Z1 including titanium oxide and the third layer including titanium oxide.

In this embodiment, the protection bump BP has a dual-layer structure, but the invention is not limited thereto. In other embodiments, the protection bump BP is a structure with more than three layers.

In this embodiment, the arrangement of the protection bump BP can improve the yield of the laser transfer process.

Figure 5A:
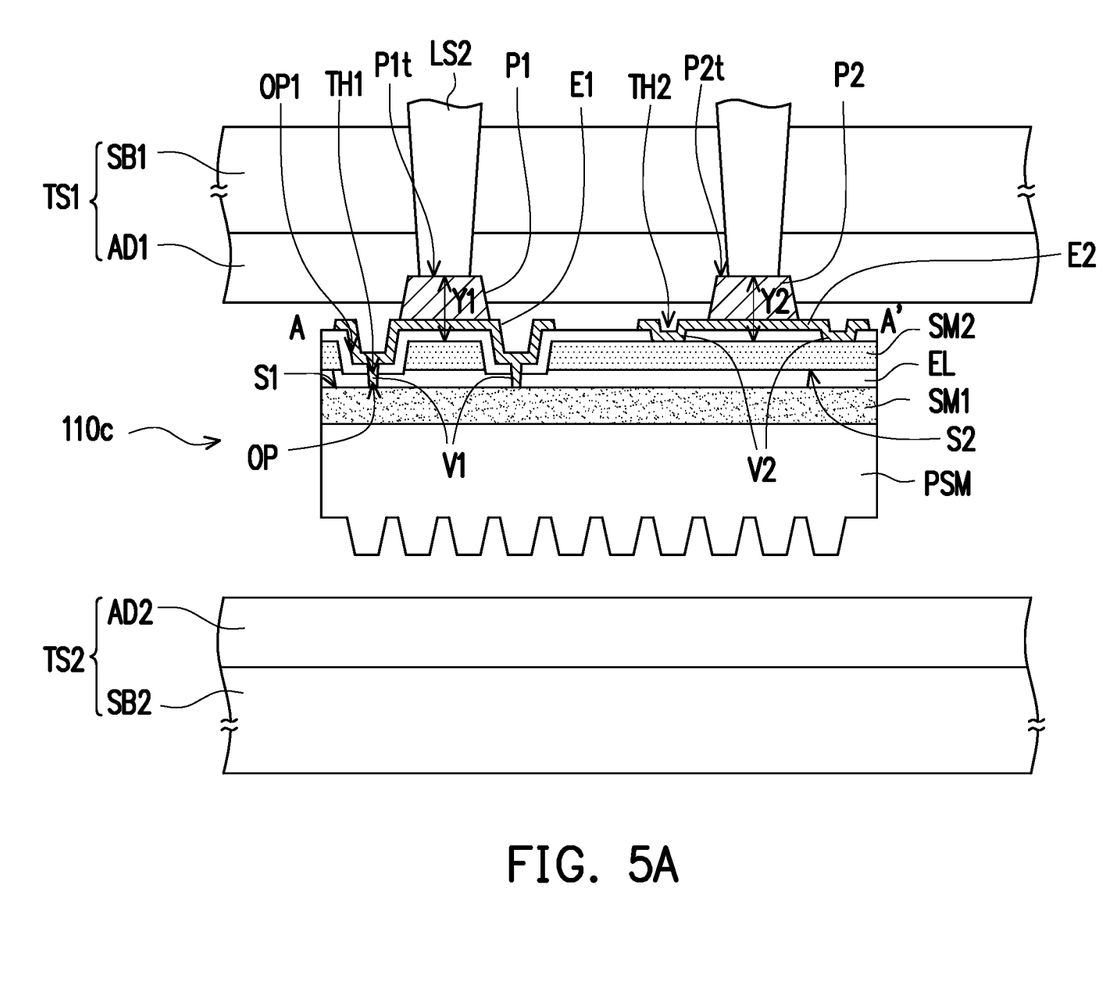
FIG. 5A is a schematic cross-sectional view of a method of manufacturing a light emitting diode display device according to an embodiment of the invention.
Figure 5B:
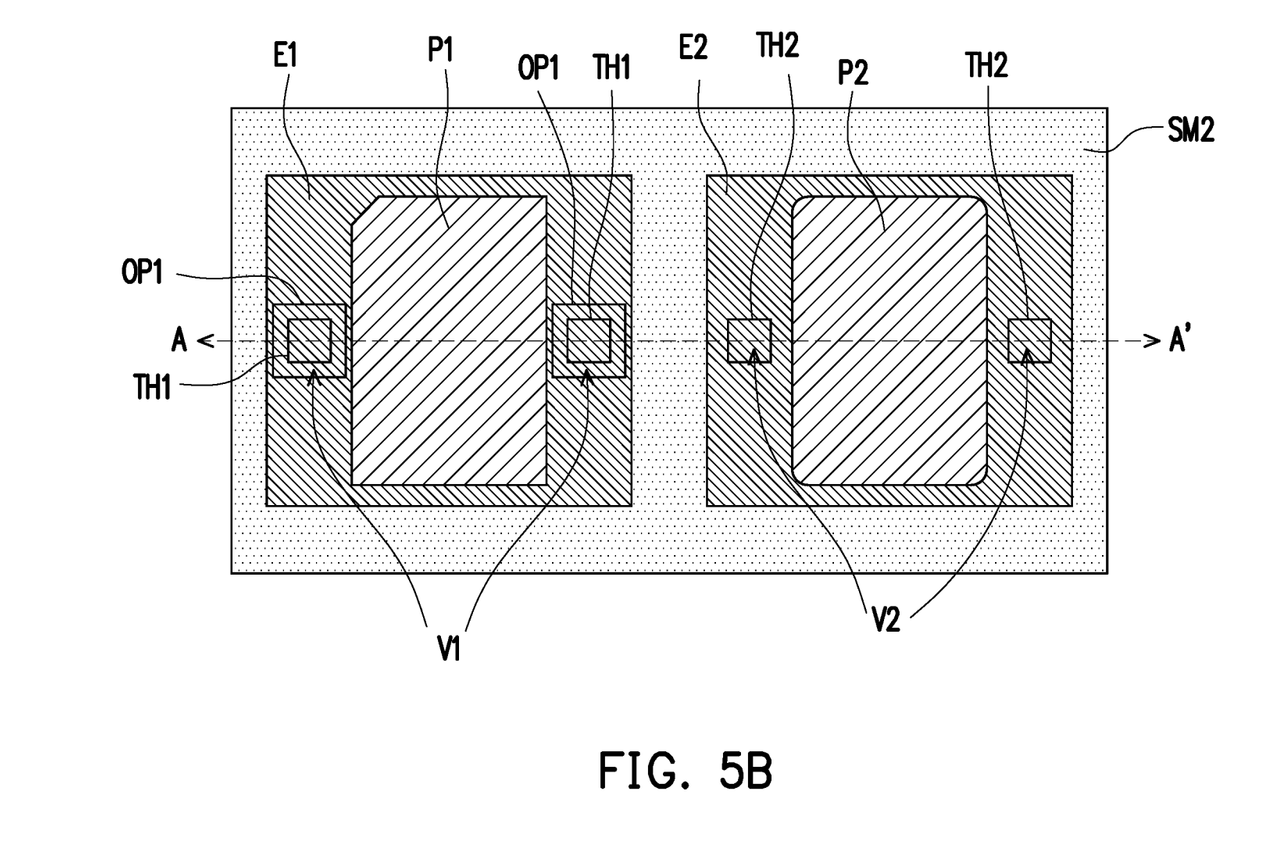
FIG. 5B is a schematic top view of the light emitting diode of FIG. 5A.

FIG. 5A is a schematic cross-sectional view of a method of manufacturing a light emitting diode display device according to an embodiment of the invention. FIG. 5B is a schematic top view of the light emitting diode of FIG. 5A. The light-emitting diode of FIG. 5A corresponds to the position of the line A-A' in FIG. 5B. For the convenience of description, some components of the light-emitting diode are omitted in FIG. 5B.

FIG. 5A corresponds to the step of FIG. 1C that is the laser transfer step of transferring the light-emitting diode 110c from the first transposed substrate TS1 to the second transposed substrate TS2.

Referring to FIG. 5A and FIG. 5B, the light emitting diode 110c includes a first semiconductor layer SM1, a second semiconductor layer SM2, an insulating layer IL, a first pad P1, a second pad P2, a first conductive via V1, and a second conductive via V2. In this embodiment, the light emitting diode 110c further includes a light emitting layer EL and a patterned semiconductor layer PSM.

The second semiconductor layer SM2 is overlapping with the first semiconductor layer SM1. The first surface S1 of the first semiconductor layer SM1 faces the second surface S2 of the second semiconductor layer SM2. The second semiconductor layer SM2 has a first opening OP1 such that the area of the first surface S1 of the first semiconductor layer SM1 is larger than the area of the second surface S2 of the second semiconductor layer SM2. The number and position of the first opening OP1 can be adjusted according to actual needs.

One of the first semiconductor layer SM1 and the second semiconductor layer SM2 is an N-type doped semiconductor, and the other is a P-type doped semiconductor. For example, the first semiconductor layer SM1 is an N-type semiconductor layer, and the second semiconductor layer SM2 is a P-type semiconductor layer. In some embodiments, the materials of the first semiconductor layer SM1 and the second semiconductor layer SM2 include, for example, gallium nitride, indium gallium nitride (InGaN), gallium arsenide, aluminum gallium indium phosphide (AlGaInP), or other materials composed of IIIA group and VA group elements, or other suitable materials, but the present invention is not limited thereto.

The light emitting layer EL is located between the first surface S1 of the first semiconductor layer SM1 and the second surface S2 of the second semiconductor layer SM2. The light-emitting layer EL has, for example, a quantum well (QW), such as a single quantum well (SQW), a multiple quantum well (MQW) or other quantum wells. The holes provided by the P-type doped semiconductor layer and the electrons provided by the N-type doped semiconductor layer can combine in the light-emitting layer EL and release energy in the form of light. The light emitting layer EL has an opening OP, and the opening OP of the light emitting layer EL is overlapping with the first opening OP1 of the second semiconductor layer SM2.

The patterned semiconductor layer PSM is located on the side of the first semiconductor layer SM1 opposite to the second semiconductor layer SM2. In some embodiments, the material of the patterned semiconductor layer PSM includes, for example, gallium nitride, indium gallium nitride (InGaN), gallium arsenide, aluminum gallium indium phosphide (AlGaInP), or other materials composed of IIIA group and VA group elements, or other suitable materials. In some embodiments, the patterned semiconductor layer PSM includes the same material as the first semiconductor layer SM1, but the doping concentration of the patterned semiconductor layer PSM is, for example, less than the doping concentration of the first semiconductor layer SM1. In some embodiments, the patterned semiconductor layer PSM is an undoped semiconductor layer.

The insulating layer IL is located on the second semiconductor layer SM2 and located in the first opening OP1 of the second semiconductor layer SM2. The insulating layer IL covers the sidewall of the first opening OP1.

The insulating layer IL has first holes TH1 and second holes TH2. The first holes TH1 are overlapping with the first openings OP1 of the second semiconductor layer SM2 and the openings OP of the light emitting layer EL. The first semiconductor layer SM1 is exposed at the bottom of the first holes TH1, and the second semiconductor layer SM2 is exposed at the bottom of the second holes TH2.

In this embodiment, the sidewalls of the first holes TH1 of the insulating layer IL are aligned with the sidewalls of the openings OP of the light emitting layer EL, but the invention is not limited thereto. In other embodiments, the insulating layer IL is filled in the openings OP of the light emitting layer EL, and the insulating layer IL covers the sidewalls of the openings OP. In other words, the size of the first holes TH1 may be greater than, equal to, or smaller than the size of the openings OP.

The first conductive material E1 is filled into the first openings OP1, the openings OP, and the first holes TH1 to form first conductive vias V1 electrically connected to the first semiconductor layer SM1. The first conductive vias V1 penetrate the second semiconductor layer SM2, the light emitting layer EL, and the insulating layer IL.

The second conductive material E2 is filled into the second holes TH2 to form second conductive vias V2 electrically connected to the second semiconductor layer SM2. The second conductive vias V2 penetrate the insulating layer IL.

In some embodiments, the first conductive material E1 and the second conductive material E2 include indium tin oxide, indium zinc oxide, or other suitable transparent conductive materials. In some embodiments, the first conductive material E1 and the second conductive material E2 include metal materials with good conductivity, such as gold, silver, copper, or alloys of the foregoing metals, or other metal materials.

The first pad P1 and the second pad P2 are located on the insulating layer IL. In this embodiment, the first pad P1 and the second pad P2 are respectively located on the first conductive material E1 and the second conductive material E2. The first pad P1 is electrically connected to the first semiconductor layer SM1. The second pad P2 is electrically connected to the second semiconductor layer SM2. The first pad P1 and the second pad P2 are single-layer or multi-layer structures, and the materials thereof include, for example, metals, conductive oxides, conductive nitrides, or other suitable conductive materials.

The first conductive vias V1 electrically connect the first pad P1 to the first semiconductor layer SM1. The first conductive material E1 is located between the first pad P1 and the insulating layer IL. The second conductive vias V2 electrically connect the second pad P2 to the second semiconductor layer SM2. The second conductive material E2 is located between the second pad P2 and the insulating layer IL.

In this embodiment, the first pad P1 is laterally located between two first conductive vias V1, but the invention is not limited thereto. The shape, number, and position of the first conductive vias V1 can be adjusted according to actual needs. In this embodiment, the second pad P2 is laterally located between two second conductive vias V2, but the invention is not limited thereto. The shape, number, and position of the second conductive vias V2 can be adjusted according to actual needs.

In this embodiment, both of the first pad P1 and the second pad P2 are overlapping with the second semiconductor layer SM2, so that the level height of the topmost surface P1$t$ of the first pad P1 and the level height of the topmost surface P2$t$ of the second pad P2 are approximately the same. When performing the laser transfer step, two lasers LS2 are respectively aligned with the first pad P1 and the second pad P2. Since the level height of the topmost surface P1$t$ of the first pad P1 and the level height of the topmost surface P2$t$ of the second pad P2 are approximately the same, the light-emitting diode 110$c$ bears more uniform force at the first pad P1 and the second pad P2, thereby preventing the rotation issue of the light emitting diode 110$c$ when the light emitting diode 110$c$ leaving the adhesive layer AD1, so as to improve the yield of laser transfer. In other words, in this embodiment, the arrangement of the first pad P1 and the second pad P2 overlapping the second semiconductor layer SM2 can improve the yield of the laser transfer process.

In addition, the level height of the topmost surface P1$t$ of the first pad P1 and the level height of the topmost surface P2$t$ of the second pad P2 are approximately the same, which is beneficial to the process of simultaneously electrically connecting the first pad P1 and the second pad P2 to the circuit substrate (such as the process as shown in FIG. 1E), thereby increasing the production yield of the light-emitting diode display device.

In some embodiments, taking the upper surface of the second semiconductor layer SM2 as a reference, the height Y1 of the topmost surface P1$t$ of the first pad P1 is equal to the height Y2 of the topmost surface P2$t$ of the second pad P2.

Figure 6:
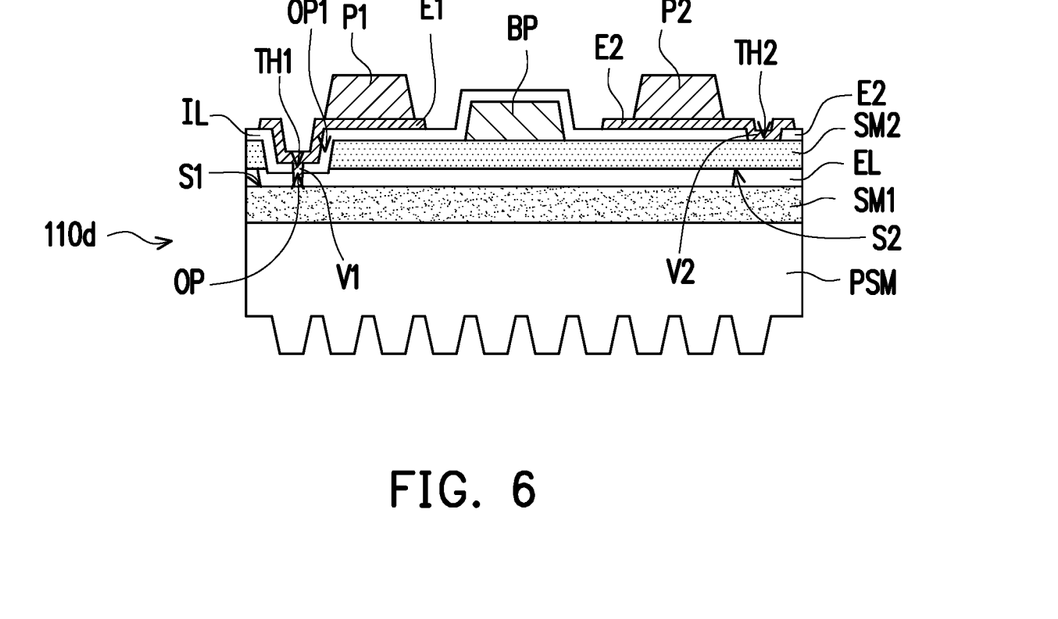
FIG. 6 is a schematic cross-sectional view of a light emitting diode according to an embodiment of the invention.

FIG. 6 is a schematic cross-sectional view of a light emitting diode according to an embodiment of the invention. It must be noted here that the embodiment of FIG. 6 follows the reference numerals and partial contents of the embodiment of FIG. 5A and FIG. 5B, wherein the same or similar components are denoted by the same or similar reference numerals, and the description of the same technical content is omitted. For the description of the omitted parts, reference may be made to the foregoing embodiments and will not be repeated in the following embodiments.

The difference between the light-emitting diode 110$d$ of FIG. 6 and the light-emitting diode 110$c$ of FIG. 5A and FIG. 5B is that the light-emitting diode 110$d$ further includes a protection bump BP.

Referring to FIG. 6, the protection bump BP is located between the first pad P1 and the second pad P2. In this embodiment, the protection bump BP is formed on the second semiconductor layer SM2, and the protection bump BP and the second pad P2 is directly in contact with the second semiconductor layer SM2. The protection bump BP is not in contact with the first pad P1 and the second pad P2. In some embodiments, the protection bump BP is located between the insulating layer IL and the second semiconductor layer SM2, thereby preventing the first pad P1 and/or the second pad P2 from directly in contact with the protection bump BP. In this embodiment, the material of the protection bumps BP includes metal (such as gold, silver, aluminum, or alloys thereof, or other metal materials), inorganic materials (such as titanium oxide, silicon oxide, or stacked layers thereof, or other inorganic materials) or organic material. In some embodiments, the protection bump BP includes a material with a transmittance for the laser LS2 of less than 10%.

In this embodiment, when performing the laser transfer, the laser can be selectively aligned with the position of the protection bump BP rather than the positions of the first pad P1 and the second pad P2. Using the laser aligned with the protection bump BP can prevent the rotation issue of the light-emitting diode 110d when the light-emitting diode 110d leaving the adhesive layer, thereby improving the yield of the laser transfer.

Figure 7:
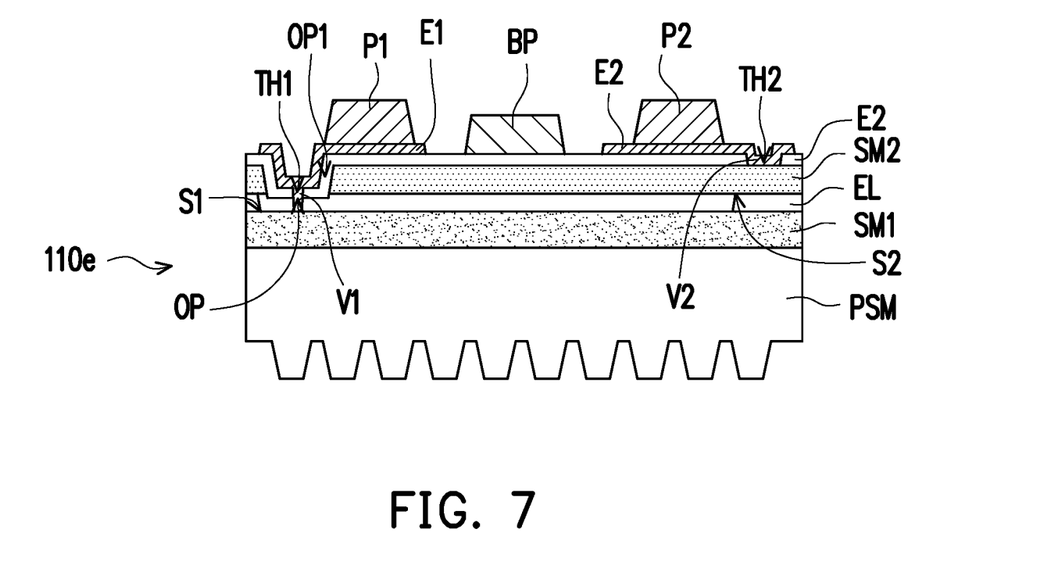
FIG. 7 is a schematic cross-sectional view of a light emitting diode according to an embodiment of the invention.

FIG. 7 is a schematic cross-sectional view of a light emitting diode according to an embodiment of the invention. It must be noted here that the embodiment of FIG. 7 follows the reference numerals and partial contents of the embodiment of FIG. 6, wherein the same or similar components are denoted by the same or similar reference numerals, and the description of the same technical content is omitted. For the description of the omitted parts, reference may be made to the foregoing embodiments and will not be repeated in the following embodiments.

The difference between the light-emitting diode 110e of FIG. 7 and the light-emitting diode 110d of FIG. 6 is that in the light-emitting diode 110e, the protection bump BP is formed on the insulating layer IL.

Referring to FIG. 7, the protection bump BP is formed on the insulating layer IL, and the insulating layer IL is located between the protection bump BP and the second semiconductor layer SM2.

In this embodiment, the protection bump BP is not in contact with the second semiconductor layer SM2, the first pad P1 and the second pad P2. In this embodiment, the material of the protection bumps BP includes metal (such as gold, silver, aluminum, or alloys thereof, or other metal materials), inorganic materials (such as titanium oxide, silicon oxide, or stacked layers thereof, or other inorganic materials) or organic, or stacked layers of the foregoing materials. In some embodiments, the protection bump BP includes a material with a transmittance for the laser LS2 of less than 10%.

In this embodiment, when performing the laser transfer, the laser can be selectively aligned with the position of the protection bump BP rather than the positions of the first pad P1 and the second pad P2. Using the laser aligned with the protection bump BP can prevent the rotation issue of the light emitting diode 110e when the light emitting diode 110e leaving the adhesive layer, thereby improving the yield of the laser transfer.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting diode, comprising:
a first semiconductor layer and a second semiconductor layer overlapping with each other, wherein an area of a first surface of the first semiconductor layer is larger than an area of a second surface of the second semiconductor layer, wherein the first surface faces the second surface;
a first pad, electrically connected to the first semiconductor layer;
a second pad, electrically connected to the second semiconductor layer;
a protection bump, located between the first pad and the second pad; and
an insulating layer, located on a surface of the first semiconductor layer and a surface of the second semiconductor layer, wherein the insulating layer has a first hole and a second hole, the first pad and the second pad are respectively located in the first hole and the second hole, and the protection bump is located between the insulating layer and the second semiconductor layer.

2. The light emitting diode of claim 1, wherein taking the first surface of the first semiconductor layer as a reference, a height of a topmost surface of the insulating layer is lower than a height of a topmost surface of the first pad and a height of a topmost surface of the second pad.

3. The light emitting diode of claim 1, wherein the protection bump and the second pad are directly in contact with the second semiconductor layer.

4. The light-emitting diode of claim 1, wherein the protection bump comprises a material with a transmittance for a laser of less than 10%.

5. The light emitting diode of claim 1, wherein the protection bump is a multi-layer structure.

6. The light emitting diode of claim 1, wherein the protection bump is not in contact with the first pad and the second pad.

7. The light-emitting diode of claim 1, wherein a length of the protection bump in a first direction is equal to or greater than 3 micrometers and smaller than a length of the light emitting diode in the first direction.

8. A light-emitting diode, comprising:
a first semiconductor layer and a second semiconductor layer overlapping with each other, wherein an area of a first surface of the first semiconductor layer is larger than an area of a second surface of the second semiconductor layer, wherein the first surface faces the second surface;
a first pad, electrically connected to the first semiconductor layer;
a second pad, electrically connected to the second semiconductor layer; and
a protection bump, located between the first pad and the second pad, wherein taking the first surface of the first semiconductor layer as a reference, a height of a topmost surface of the protection bump is lower than a height of a topmost surface of the first pad and a height of a topmost surface of the second pad; and
an insulating layer, located on a surface of the first semiconductor layer and a surface of the second semiconductor layer, wherein the insulating layer has a first hole and a second hole, the first pad and the second pad are respectively located in the first hole and the second hole, and the insulating layer is located between the protection bump and the second semiconductor layer.

9. A light-emitting diode, comprising:
a first semiconductor layer;
a second semiconductor layer overlapping with the first semiconductor layer;
an insulating layer, located on the second semiconductor layer;
a first pad and a second pad, located on the insulating layer, and both of the first pad and the second pad are overlapping with the second semiconductor layer;
a first conductive via, penetrating through the second semiconductor layer and the insulating layer, and electrically connecting the first pad to the first semiconductor layer; and
a second conductive via, penetrating through the insulating layer and electrically connecting the second pad to the second semiconductor layer.

10. The light emitting diode of claim 9, wherein taking the second semiconductor layer as a reference, a height of a topmost surface of the first pad is equal to a height of a topmost surface of the second pad.

11. The light-emitting diode of claim 9, wherein the second semiconductor layer has a first opening overlapping with the first semiconductor layer, the insulating layer covers a sidewall of the first opening, and the insulating layer has a first hole overlapping with the first opening, a first conductive material is filled into the first opening and the first hole to form the first conductive via.

12. The light emitting diode of claim 11, wherein the first conductive material is located between the first pad and the insulating layer.

13. The light emitting diode of claim 9, wherein the insulating layer has a second hole overlapping with the second semiconductor layer, and a second conductive material is filled into the second hole to form the second conductive via.

14. The light emitting diode of claim 13, wherein the second conductive material is located between the second pad and the insulating layer.

15. The light-emitting diode of claim 9, further comprises:
a protection bump, located between the first pad and the second pad.

16. The light emitting diode of claim 15, wherein the insulating layer is located between the protection bump and the second semiconductor layer.

17. The light emitting diode of claim 15, wherein the protection bump is located between the insulating layer and the second semiconductor layer.

18. The light emitting diode of claim 15, wherein the protection bump is not in contact with the first pad and the second pad.

19. The light emitting diode of claim 15, wherein the first pad is laterally located between two first conductive vias, and the second pad is laterally located between two second conductive vias.

* * * * *